(12) United States Patent
Dingemanse

(10) Patent No.: US 7,565,591 B2
(45) Date of Patent: Jul. 21, 2009

(54) TESTING OF CIRCUITS WITH MULTIPLE CLOCK DOMAINS

(75) Inventor: Johannes Dingenus Dingemanse, Nijmegen (NL)

(73) Assignee: NXP B.V., Eindhoven (NL)

( * ) Notice: Subject to any disclaimer, the term of this patent is extended or adjusted under 35 U.S.C. 154(b) by 258 days.

(21) Appl. No.: 10/586,217

(22) PCT Filed: Jan. 13, 2005

(86) PCT No.: PCT/IB2005/050152

§ 371 (c)(1),
(2), (4) Date: Jul. 14, 2006

(87) PCT Pub. No.: WO2005/071426

PCT Pub. Date: Aug. 4, 2005

(65) Prior Publication Data

US 2007/0186132 A1 Aug. 9, 2007

(30) Foreign Application Priority Data

Jan. 19, 2004 (EP) ................... 04100143

(51) Int. Cl.
*G01R 31/28* (2006.01)

(52) U.S. Cl. ..................... 714/726; 714/738

(58) Field of Classification Search .............. 714/726, 714/727, 729
See application file for complete search history.

(56) References Cited

U.S. PATENT DOCUMENTS

| 6,442,722 | B1 * | 8/2002 | Nadeau-Dostie et al. ..... 714/731 |
| 6,966,021 | B2 * | 11/2005 | Rajski et al. ................. 714/726 |
| 7,134,061 | B2 * | 11/2006 | Agashe et al. ............... 714/726 |
| 2002/0069385 | A1 | 6/2002 | Hapke |
| 2002/0138801 | A1 * | 9/2002 | Wang et al. ................. 714/729 |
| 2002/0184560 | A1 | 12/2002 | Wang et al. |

\* cited by examiner

*Primary Examiner*—James C Kerveros
(74) *Attorney, Agent, or Firm*—Peter Zawilski

(57) ABSTRACT

Consistent with an example embodiment, the amount of time required for testing circuits that contain a plurality of different clock domains is reduced. According to the embodiment, during selection of the input test pattern to test logic circuits between a timing sensitive flip-flop in a first clock domain that captures a response that depends on test data in a source flip-flop in a second, different clock domain, account is taken of whether the data in the first flip-flop will change value if it is clocked when the response is captured. If not, it may be assumed that uncertainty about the timing relationship of different clock domains does not introduce uncertainty with respect to the data from the timing sensitive flip-flop, so that the response data at the second flip-flop can be treated as reliable.

10 Claims, 4 Drawing Sheets

TESTING OF CIRCUITS WITH MULTIPLE CLOCK DOMAINS

Figure 1:
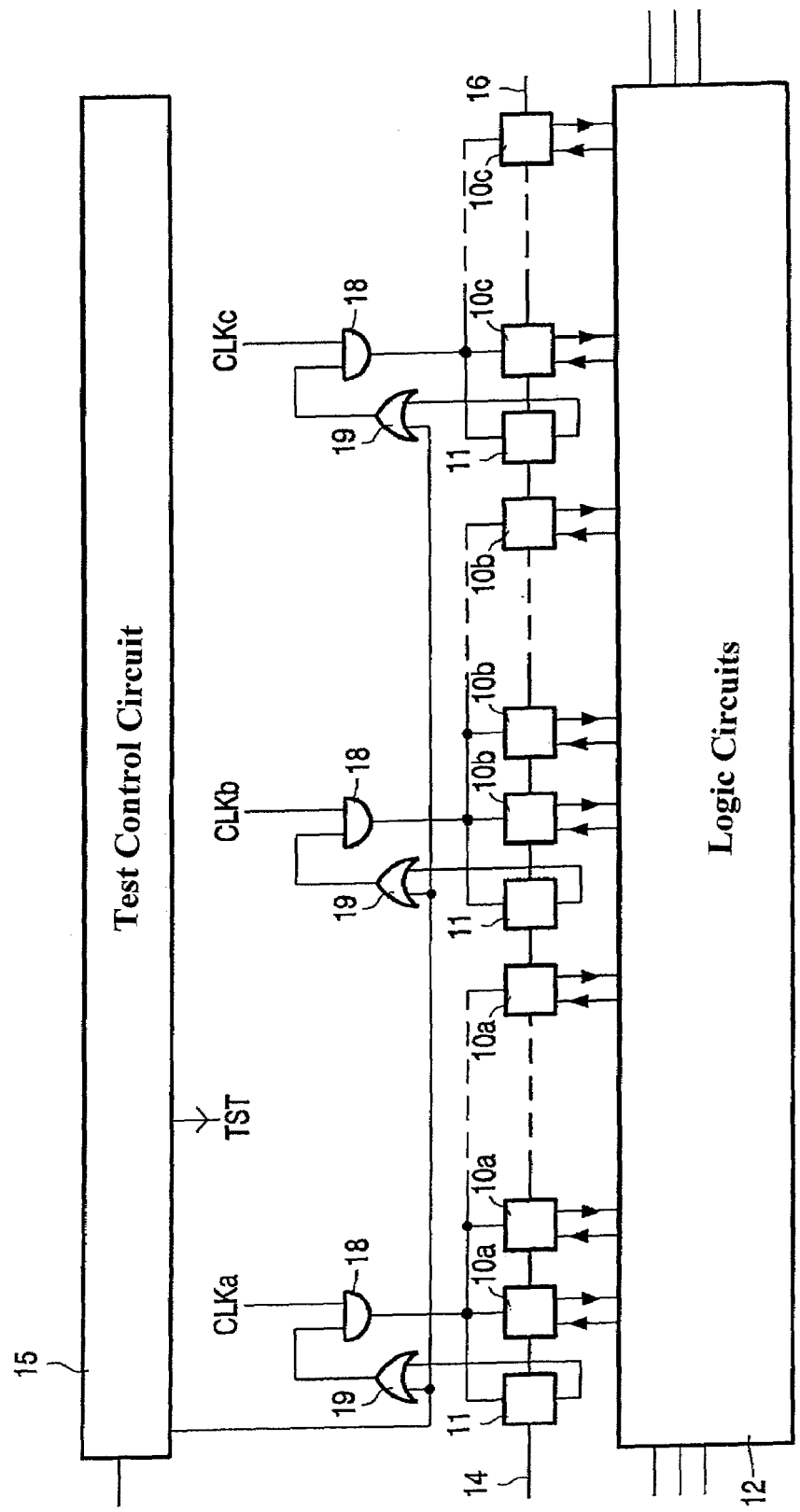

The invention relates to testing of circuits and in particular integrated circuits.

U.S. patent application No. 2002/0069385 describes a method of testing an integrated circuit that has a plurality of clock domains.

A conventional way of testing a circuit uses a scan chain technique for testing a circuit with logic circuits and flip-flops that have operation inputs and outputs connected to the logic circuits. During the test the circuit is switched to a mode in which the flip-flops are temporarily disconnected from their operational inputs and switched to form a shift register. A test input pattern is entered through the shift register, so that each flip-flop receives a respective bit of the test pattern. Next, the flip-flops are switched back to their normal operational inputs and outputs for one clock cycle, in order to capture the response of logic circuits to the test pattern in the flip-flops. Subsequently, the flip-flops are again switched to form a shift register through which the captured response of the logic circuit is extracted.

A circuit specific set of test patterns is needed to realize an economical and reliable test of a particular circuit. Test design technologies for selecting sets of input patterns are known per se. The task of the test design technology is to find a set with a minimum number of test patterns so that the effect of each of a selected set of faults will be observable in the response to at least one of the test patterns. One set of faults is for example the set of "stuck-at" faults at all circuit nodes of the logic circuits, owing to which a circuit node would remain at fixed logic level independent of the input signals of the logic circuit. In order to test for stuck at faults, the set of test patterns must include patterns so that each circuit node is driven to a logic value opposed to the possible stuck at value by at least one of the test patterns, and so that the logic value at the node affects the observable response of the circuit. On the other hand, the number of test patterns in the set should be minimized, because test time and therefore cost of an integrated circuit increases when increasing numbers of test input patterns are needed.

Known test design technology assumes a circuit with a single clock to capture the test response. However, modern integrated circuits often include a plurality of clock domains. That is, they use a plurality of different clock signals without assuming predetermined relative timing relationships between different clock signals. Each clock signal clocks a respective group of the flip-flops. Interface circuits between the different groups ensure that data transfer between the groups is not dependent on the exact timing relationship of the clock signals. The presence of different clock domains presents a problem for testing. The value of response data that is captured in a flip-flop that is clocked with a clock from one domain and depends on timing of clocks in another clock domain can become uncertain even in a faultless integrated circuit.

U.S. patent application No. 2002/0069385 discloses how reliable testing is possible for multi clock domain circuits. In the circuit the possibility is created to disable the clock signals to the flip-flops of selectable clock domains during capture of the response to test input data. In this way test conditions can be created where test response data depends on the enabled clock signal of only one clock domain, so that uncertainty is removed. In principle, a reliable test can be ensured by enabling the clock signal of only one clock domain at a time.

U.S. patent application No. 2002/0069385 notes, however, that enabling the clock signal of only one clock domain at a time is not necessary to test faults in logic circuits that connect flip-flops within the same clock domain. These faults can be tested while all clock signals are enabled. Thus, faults in different clock domains can be tested in parallel, which reduces the number of required test patterns, and thereby the test time and testing cost. Faults that cannot be reliably tested while clocks signals of all clock domains are enabled are tested by disabling the clock signals of all but one of the domains involved.

By using a trick, conventional single clock domain test pattern generation software can be used to generate the required set of test patterns also for testing this type of multi-clock domain circuit. The test patterns are assumed to include clock status signals, which indicate which of the clock domains will be enabled for capturing the response to the test pattern. The use of conventional test pattern generation software is made possible by generating the test patterns for a "virtual" circuit whose design is adapted from the actual design of the circuit under test, instead of for the actual design.

The adaptation is made by adding circuits so that in the virtual circuit the effects of signals that depend on clock timing appear to be made invisible under control of the clock status signals, if the relevant clocks are not disabled. This forces the conventional test pattern generation software to include test patterns with values of the clock status signals that disable selected clock domains. Thus, the conventional test pattern generation software can proceed as if there were just a single clock domain. For each resulting test pattern, it is determined which part of the response indicates faults in the added virtual circuits (determination of circuits that may cause an aberration in a bit of a test response is a standard option of conventional test design technology). These parts of the response are ignored for testing purposes, because in the real circuit they are affected by timing inaccuracy.

Originally, it was believed that this technique would not require many additional test input patterns, since logic circuits that are connected between flip-flops that are clocked by different clocks were expected to be of limited complexity. In practice, however, it has been found that many logic circuits require a significant additional number of test patterns, with a correspondingly significant increase of test time.

Among others it is an object of the invention to reduce the amount of test time required for testing circuits that contain a plurality of different clock domains.

A circuit testing system according to the invention is set forth in claim 1. According to the invention, during selection of the input test pattern to test logic circuits between a timing sensitive flip-flop in a first clock domain that captures a response that depends on test data in a source flip-flop in a second, different clock domain, account is taken of whether the data in the first flip-flop will change value if it is clocked when the response is captured. If not, it may be assumed that uncertainty about the timing relationship of different clock domains does not introduce uncertainty with respect to the data from the timing sensitive flip-flop, so that the response data at the second flip-flop can be treated as reliable.

This insight is used to reduce the number of test input patterns that is needed to detect all required faults, by covering faults using fault detection dependent on a response to a particular test pattern captured by a timing sensitive flip-flop cell (10$a$-$c$) in a first clock domain, where the timing sensitive flip-flop cell (10$a$-$c$) receives data dependent on data from a source flip-flop cell (10$a$-$c$) that belongs to a second clock domain different from the first clock domain and the combination of selectively enabled domain clock signals associated with the particular test pattern comprises the clocks of both the first and second domain. In the particular test pattern the data value in the source flip-flop cell (10a-c) is identical to a response value captured by the source flip-flop cell (10a-c) for the particular test pattern.

Preferably, the invention is implemented by selecting the test patterns as if the test will be performed for another circuit that selectively disables a dependence of an input signal of the timing sensitive flip-flop on data from the source flip-flop according to the original design, when clock status signals indicate that the second domain clock is disabled, the additional circuits also being designed to enable the dependence when the input and output signals of the source flip-flop are identical and/or the clock status signal indicates that the second domain clock is disabled. Thus, conventional single clock domain test pattern selection equipment may be used to select a set of test patterns that covers the required faults. Test pattern selection may be performed in a test apparatus that also supplies the test patterns to the device under test. However test pattern selection may also be performed in a separate computer which is suitably programmed for this purpose, programs for this purpose can be supplied via a network, or be resident on disk or in another type of computer readable memory. In this case the test patterns can be sent to the test apparatus via a network, or on some other medium such as on a machine readable disk or tape.

These and other objects and advantageous aspects of the invention will be described in more detail by means of non-limitative examples using the following figures.

Figure 1A:
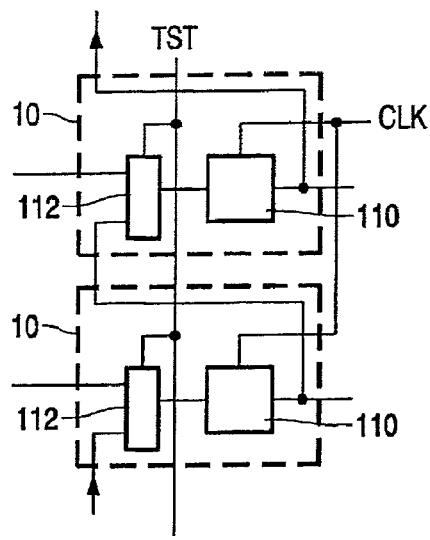
Figure 2:
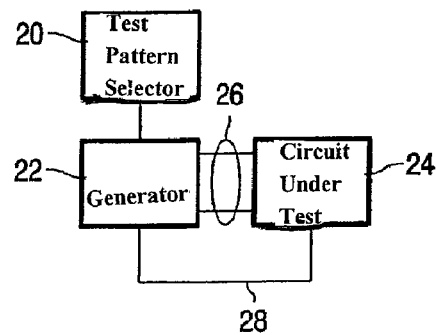
Figure 3:
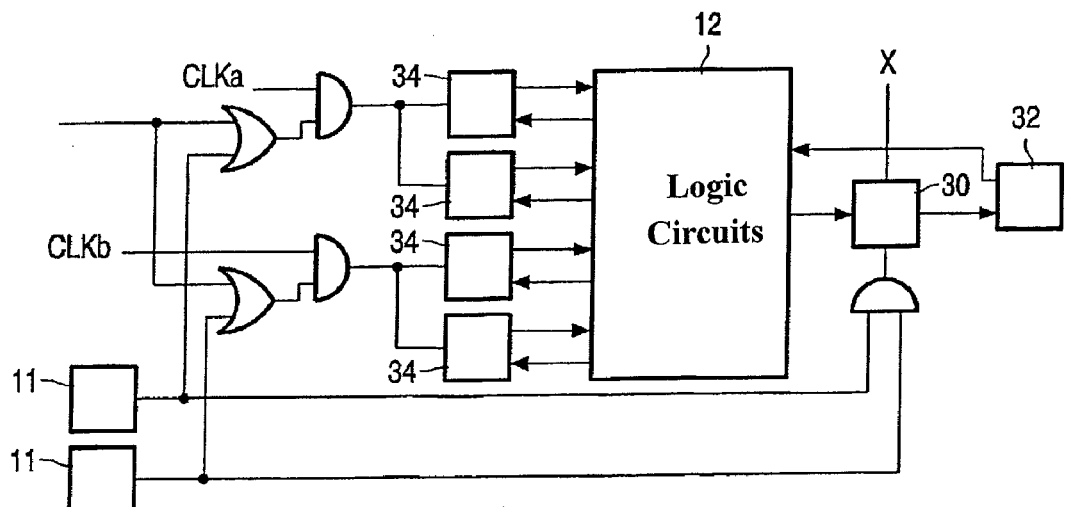
Figure 4:
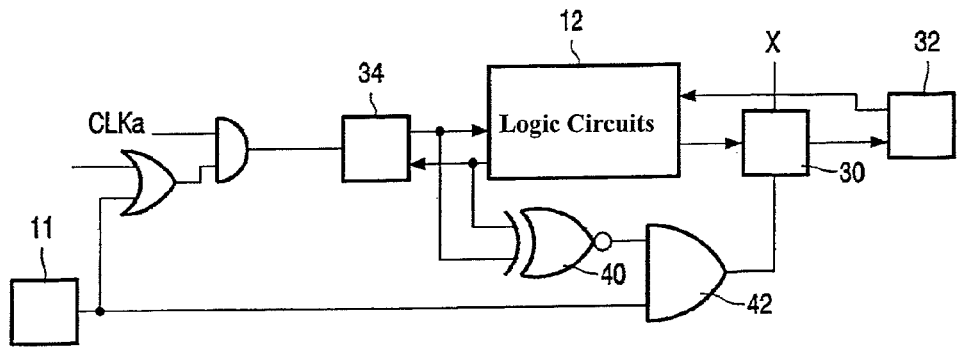
Figure 5:
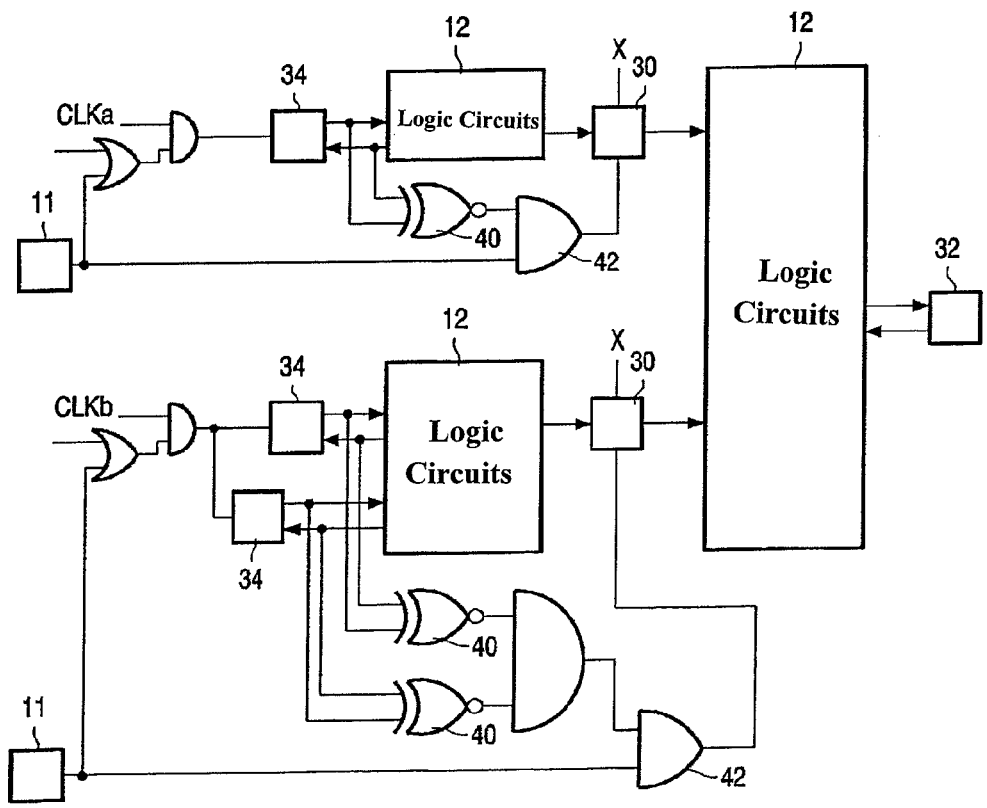
Figure 6:
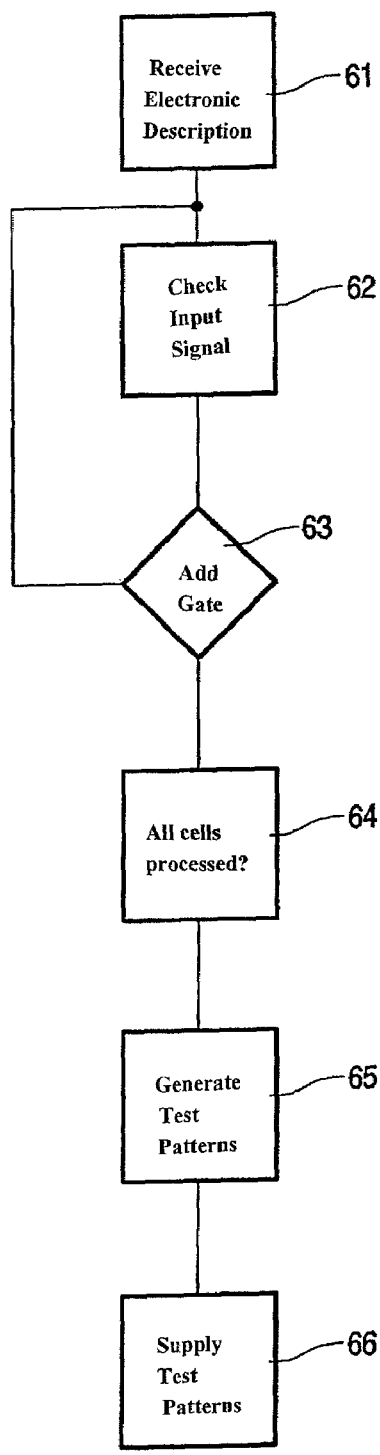

FIG. 1 shows an example of a testable circuit;
FIG. 1a shows part of a chain of flip-flop cells;
FIG. 2 shows a test system;
FIG. 3 shows part of a virtual circuit;
FIG. 4 shows another virtual circuit;
FIG. 5 shows another virtual circuit;
FIG. 6 shows a flow chart for testing a circuit.

FIG. 1 schematically shows an example of a testable circuit with a plurality of flip-flop cells 10a-c, 11, a collection of logic circuits 12 (shown as a box) and a test control circuit 15. Functional flip-flop cells 10a-c have operational inputs and outputs coupled to the logic circuits 12. Furthermore, flip-flop cells 10a-c, 11 have serial shift input and outputs, connected in a scan chain, with an input 14 and an output 16.

FIG. 1a shows an embodiment of a flip-flop cell 10 that may be used in the circuit of FIG. 1. Each cell 10 comprises a multiplexer 112 and a flip-flop 110. Multiplexer 112 has inputs coupled to an input of cell 10 and to a data output of a flip-flop 110 of a preceding cell. In each cell 10 an output of the multiplexer 112 is connected to a data input of the flip-flop 110 of the cell 10. The data output of flip-flop 110 forms a data output of the cell. Flip-flop 110 is clocked with the clock signal of the cell. A test control signal controls multiplexers 112 of cells 10 so that either input and output data are exchanged with logic circuits 12, or data is shifted from one cell to the other in response to the clock signal. Optionally, additional flip-flops may be inserted between flip-flops 110, and clocked between clocking of flip-flops 110.

The circuit comprises a plurality of clock domains, each containing a respective group of the flip-flop cells 10a-c, 11 and each having a clock input CLKa, CLKb, CLKc for a respective clock signal. Clock enable gates 18, 19 are provided, which make it possible to disable clocks from selected ones of inputs CLKa, CLKb, CLKc. OR gates 19 generate a clock enable signal for respective clock domains when test control circuit 15 indicates that an enable signal should be generated or when data from clock domain control flip-flop cells 11 indicate that the clock signal should be passed. AND gates 18 pass the clock signals from inputs CLKa, CLKb, CLKc when enable signals have been generated.

It should be appreciated that the circuits of FIG. 1 and 1a are shown by way of example of a circuit with a scan chain and clock domains that can be selectively enabled during testing. The exact implementation is not relevant to the invention.

In operation the circuit test control circuit 15 controls whether the circuit operates in a normal mode and in a test mode. In the normal mode flip-flop cells 10a-c receive and supply data from and to logic circuits 12. Clock signals CLKa, CLKb, CLKc are applied to the flip-flop cells 10a-c. No predetermined timing relation between the clock signals is required: the clock signals may be derived from different oscillators, which are locked to some clock source, for example. Data in a flip-flop cell 10a-c is updated at time points defined by the clock signal CLKa, CLKb, CLKc that is applied to the flip-flop cell 10a-c.

In principle logic circuits 12 may contain intra clock domain logic circuits, which have logic inputs and outputs coupled directly, or indirectly via other logic circuits, to flip-flop cells 10 that receive a same single clock signal CLKa, CLKb, CLKc only. Other logic circuits may be inter-domain logic circuits connected to flip-flop cells 10 from more than one clock domain, for example with one or more inputs coupled to a flip-flop cell 10a of one clock domain and an output coupled a flip-flop cell 10b of another clock domain (different inputs, in the case of multiple inputs, possibly also being connected to flip-flop cells 10a of one clock domain via different logic circuits with different delays), or with different inputs coupled to flip-flop cells 10a,b from different clock domains. Synchronization or handshake circuits, which are known per se, may be included in logic circuits 12 to handle timing of such multi-domain logic circuits.

FIG. 2 shows a test system that operates the circuit in the test mode. The test system contains a test pattern selector 20, a test data signal generator 22 and a circuit under test 24, which contains the circuit of FIG. 1. Test pattern selector 20 has an output for signaling selected patterns and expected responses to generator 22. Generator 22 has a test data input/output 26, and a clock output 28 coupled to the test input 14, the test output 16 and one or more clock inputs of circuit under test 24. Although test pattern selector 20 and generator 22 are shown separately with a connection between the two, it will be understood that they may in fact be part of the same apparatus, or alternatively that the test pattern selector is implemented in a general purpose computer which sends the set of test pattern to a tester that contains generator 22, via a network, or using one or more disks, magnetic tapes etc. that carry information that defines the set of test patterns.

In the test mode, the flip-flop cells 10a-c are first switched to shift test data from test input 14 through the flip-flop cells 10a-c, by applying a series of clock pulses to all flip-flop cells 10a-c.

Next, when the input data has arrived at the intended flip-flop cells 10a-c, a capture step is executed in which the test data propagates from these flip-flop cells 10a-c through logic circuits 12, and clock signals are applied to flip-flop cells 10a-c to capture the response of logic circuits 12 to the input data. Subsequently the flip-flop cells 10a-c are switched to shift the results data to test output 16, by applying a series of clock pulses to all flip-flop cells 10a-c.

Test results from intra clock domain logic circuits among logic circuits 12 can be captured without problems in this way in capture steps when all clock signals CLKa, CLKb, CLKc are used in the capture step.

However, the test results from intra-domain logic circuits may be uncertain if CLKa, CLKb, CLKc are all used in the capture step. This is because the timing relationships between the clocks that are involved are uncertain. Conventionally test results for testing intra domain logic circuits among logic circuits 12 is performed by disabling part of the clock signals in the capture step, so that the data content of selected flip-flop cells 10a-c is not updated in the capture step. Thus, the timing of the update of these cells 10a-c does not affect the test results in the capture step, removing uncertainty from the resulting test response.

The clock signals may be disabled with clock enable signals that have been shifted into clock control flip-flops cells 11 via the scan chain together with the test input data, but the clock signals may be disabled in any other way. Also it is not necessary that clock signals of the flip-flop cells 10a-c of an entire clock domain are disabled together. A more selective disabling may be used instead, to ensure that uncertainties due to timing uncertainties prevent updating only of those flip-flop cells that are relevant to a test result. Thus, effectively more clock domains are created for the purpose of testing.

Test pattern selector 20 selects a set of test input patterns. "Selecting" as used herein generally involves constructing suitable test patterns, thus effectively a selection is made from the total set of possible test patterns. "Selection" does no presume a pre-existing set of stored test patterns from which some are used and some not. Each test pattern determines a combination of bit values that will be applied in combination from flip-flop cells 10a-c in a capture step. The set of test patterns is selected so that sufficient test coverage of some set of faults is realized with a minimum of test patterns. One set of faults requires that stuck-at faults at any gate output of the circuit of FIG. 1 should be detectable, but other or fewer faults may be included in such a set as necessary. A stuck at fault is a fault due to which a circuit node remains at a fixed logic level irrespective of the logic inputs. To test for such faults the test patterns must include a pattern that should result in the opposite level at the circuit node in such a way that this affects the captured response.

Algorithms for selecting such sets of test patterns are known per se for single clock domain logic circuits. Such known algorithms can modified to find a set of test pattern also for multi-domain logic circuits. This may be done by making the known algorithm generate test patterns for a virtual circuit that uses additional circuits to express the uncertainty due to timing uncertainty by making the additional circuits mask the uncertain results. For this purpose for each particular flip-flop cell 10a-c the flip-flop cells 10a-c (herein called the "source flip-flop cells" 10a-c of the particular flip-flop cell 10a-c) are determined that affect the signal at the input of the timing sensitive flip-flop cell 10a-c. Uncertainty may exist if at least one of these source flip-flop cells 10a-c belongs to a further clock domain (herein called the further source clock domains of the particular flip-flop cell 10a-c) other than the particular clock domain of the particular flip-flop cell 10a-c. In this case the particular flip-flop cell will be called a "timing sensitive flip-flop cell".

FIG. 3 shows how, for the purpose of selecting the test patterns, an additional gate 30 may virtually be added in front of the input of a timing sensitive flip-flop cell 32 (virtually in the sense that it is added only in the input of the program that selects the test input patterns, but not in the physical circuit). From the figure flip-flops and connections that are not relevant for the explanation have been omitted. Additional gate 30 has an input coupled to an output of the part of logic circuits 12 that is connected to input of the timing sensitive flip-flop cell 32 in the physical circuit and the additional gate 30 has an output coupled to the input of the timing sensitive flip-flop cell 32.

The additional gate 30 is specified so that its output signal depends on a clock control signals that indicate whether the clocks of all of the further source clock domains of the source flip-flop cells 34 are disabled. If not all of these clocks are disabled the additional gate passes an X value (a value that is independent of the original input signal of the timing sensitive flip-flop cell 32) to the input of the timing sensitive flip-flop cell 32. If all of these clocks are disabled the additional gate passes the output signal from logic circuits 12 that is coupled to the input of the timing sensitive flip-flop cell 32 in the physical circuit.

To the test pattern selector 20 it appears as if test patterns have to be generated for logic circuits that include logic circuits 12 plus additional gate 30 and receive clock control signals from test control flip-flop cells 11 as a normal part of the test pattern. As a result, the test pattern generator is forced to include test patterns in which the clock signals to the further source domains are disabled for the testing of faults at the outputs of the logic circuit 12 that precede the additional gate 30. Additional gate 30 makes it detectable for a conventional test pattern generator that the results at the output of additional gate 30 do not make logic signals in logic circuit 12 observable unless the further source clock or clocks of the source flip-flop cells 34 are disabled. Preferably, selector 20 is supplied with information that the set of faults that has to be detected does not include faults in the added circuits. This prevents that additional test vectors are generated to test the added logic.

As a refinement one or more additional gate 30 may be placed elsewhere in the signal paths to the input of the timing sensitive flip-flop cell 32 through logic circuits 12, instead of immediately at the input of timing sensitive flip-flop cell 32. The signal paths to the input of the timing sensitive flip-flop cell 32 branch out as a tree like structure, with source flip-flop cells 34 at the leaves and nodes in the tree corresponding to logic circuits. The location of the additional gate(s) 30 may be selected by tracing back through this tree like structure to the nearest logic circuits to the timing sensitive flip-flop cell 32, so that the input signals of each nearest logic circuit do not depend on logic data values from more than one of the further source clock domains.

In this case, one or more additional gates may virtually be added at the outputs of the selected nearest logic circuits, instead of at the input to the timing sensitive flip-flop cell 32. The additional gates 30 are specified so that the output signal of each additional gate 30 depends on whether the clock of the clock domain of the source flip-flop cells 34 from which the additional gate 30 receives signals is disabled. If this clock is enabled the additional gate passes an X value towards the input of the timing sensitive flip-flop cell 32. If this clock is disabled the additional gate 30 passes the output signal of the selected logic gate toward the input of the timing sensitive flip-flop cell 32 in the physical circuit. This makes it possible for the test pattern generator to generate fewer test patterns, because some of the logic circuits can now be tested when the clocks of more clock domains are enabled.

According to the invention, the test pattern generation takes account of whether the data values in the source flip-flop change. Thus even fewer test patterns will be needed.

FIG. 4 illustrates an additional circuit that may virtually be added to the design to make a conventional test pattern selector select test patterns taking account of signal changes. In this case an exclusive NOR gate 40 and an OR gate 42 have been added. Exclusive NOR gate 40 has inputs coupled to the input and output of a source flip-flop cell 34 of a timing sensitive flip-flop cell 32. The circuit is designed so that additional gate 30 passes the signal from the output of logic circuits 12 if the input and output signal of source flip-flop cell 34 are equal or if the clock enable signal from clock enable flip-flop cell 11 signals that the further source clock (CLKa) of the source flip-flop cell 34 is disabled.

To the test pattern selector 20 it appears as if test patterns have to be generated for logic circuits that include logic circuits 12 plus additional gate 30 and exclusive NOR gate 40 and OR gate 42 and receive clock control signals from test control flip-flop cells 11 as a normal part of the test pattern. Additional gate 30 and its control circuits make it detectable for a conventional test pattern generator that the results at the output of additional gate 30 do not make logic signals in logic circuit 12 observable unless the further source clock of the source flip-flop cell 34 is disabled or the data values of the source flip-flop cell 34 does not change when it is clocked during the test. As a result, the test pattern generator gets the choice to include test patterns in which the clock signals to the further source domains are disabled or the input and output signals of a source flip-flop cell 34 are equal. This enables the test pattern selector 20 to cover all required faults with fewer test patterns.

FIG. 5 shows how information about equality of input and output signals may be used in more complicated circuits. The figure shows the logic circuits 12 split up into a common part and parts that receives input signals only from source flip-flop cells 34 in a first and second clock domain respectively (although single connections are shown between the parts, of course more connections may present).

In the second clock domain more than one source flip-flop cell 34 affects the input signal of the timing sensitive flip-flop cell 32. In this case virtual circuits for testing whether the inputs and outputs are different are added for each source flip-flop cell 34. The circuit is designed so that additional gate 30 passes its input signal when these circuits signal that the input and output signals of each of the relevant source flip-flop cells 34 are equal or when the clock enable signal from clock enable flip-flop cell 11 for the clock domain of the source flip-flop cells 34 is disabled.

FIG. 5 furthermore shows how additional gate 30 may be placed between different parts of logic circuit 12, so that the input of each additional gate 30 depends only on data from source flip-flops in a respective clock domain and signal passing of the control gate is dependent on disabling of the clock signal for the relevant domain only. However, it will be appreciated that it is not necessary to place additional gates 30 between different parts of the logic circuits. Alternatively, a single additional gate at the input of the timing sensitive flip-flop cell 34 may be used, which passes its input signal only if for all clock domains: (a) the clock enable signal from clock enable flip-flop cell 11 signals that the clock disabled or (b) all relevant source flip-flop cells 34 from the domain have equal input and output signals.

It will be appreciated that in FIG. 5 it is necessary to provide circuits for testing whether the inputs and outputs are different are added for each source flip-flop cell 34 that potentially affects the input signal to the timing sensitive flip-flop cell 32. However, by placing the additional gates further back towards source flip-flop cells 34 this condition may be relaxed. In this case, the input of each additional gate is affected by part of the source flip-flop cells 34 in a domain and passes its input signal only if (a) the clock of the domain is disabled or (b) all source flip-flop cells 34 from the domain that can affect the input signal of the additional gate 30 have equal input and output signals. For some gates the latter possibility may be omitted, which may result in a greater number of test patterns, but will not result in lack of fault coverage.

It will be appreciated that in the circuits of the preceding figures virtual circuits have been added that are not actually present in the circuit under test. In the virtual circuits it appears as if the clock enable flip-flop-cells 11 have output connections into the logic circuits 12, which are not present in the actual circuit under test. It will also be appreciated that the circuit of FIG. 1 shows the clock enable flip-flop cells 11 as part of the scan chain for the sake of illustration. In the actual circuit under test even these clock enable flip-flop cells 11 need not be included in the scan chain, but the test generator 22 may read the clock enable bits from the test pattern and enable and disable the clocks in the various domains in any other convenient way, by not supplying clock signals to a external IC pins for the relevant clocks.

In the evaluation of the test results the response captured by timing sensitive flip-flop cell 32 is ignored for those test patterns where the clocks from further the clock domains of source flip-flop cells 34 are enabled and the input and output signals of the source flip-flop cells 32 are unequal, i.e. for those input patterns where the virtual additional gate 30 blocks the normal signal.

FIG. 6 shows a flow chart of the operation of a test pattern selector 20 that operates according to the invention. In a first step 61 the test pattern selector 20 receives an electronic description of the design of the circuit under test. In a second step 62, the test pattern selector 20 checks for each flip-flop cell 10a-c in the design whether it receives an input signal that depends on data in flip-flop cells 10a-c in other clock domains. If so test pattern selector 20 executes a third step 63 for such a timing sensitive flip-flop cell 10a-c, adding one or more additional gates to the electronic description, as described in the preceding. In a fourth step test pattern selector 20 tests whether all flip-flop cells 10a-c have been processed. If not the process is repeated from second step 62. In a fifth step 65 test pattern selector 20 generates a set of test patterns including clock enable signals, to provide full fault coverage of a set of possible faults with a minimum of test patterns. In this fifth step 65 a conventional algorithm may be used that operates as if the circuit has only a single clock domain.

Preferably, an algorithm is used that also produces an indication per bit of the response to each test pattern of the possible circuit faults that can affect this bit. For these test patterns test pattern selector 20 signals that this response bit has to be ignored in the test. Alternatively, the resulting test patterns may be analyzed to detect in which test patterns the timing sensitive flip-flop cells 32 for which additional circuits have been added the clock signals of the clock domains of source flip-flop cells are enabled, and in which of those test patterns the input and output of the source flip-flop cells 34 differ.

In a sixth step 66, test pattern selector 20 causes test pattern selector 20 to supply successive test patterns to the circuit 24 under test, by shifting in the bits of the test pattern through the chain of flip-flop cells 10a-c, 11 and to observe the response of the circuit under test for which the test selector 20 has not signaled that they should be ignored. When all patterns result in the predicted response for the relevant flip-flop cells, the circuit under test is accepted.

It will be appreciated that the invention is not limited to the process of FIG. 6. For example, it is preferable to add virtual additional gates that detect whether the output signal of all source flip-flops in the "wrong" clock domain in response to the test pattern is identical to the input signal in response to the test pattern. However, this detection may be omitted for arbitrary ones of the source flip-flop cells 34. This merely results in less efficient testing, not in errors.

Similarly, it will be appreciated that a minimum of changes to the test pattern generation is needed if the test pattern generation step 65 is "fooled" into treating the clock enable signals of the various clock domains as normal input bits in the test patterns. However, without deviation from the invention these bits may be given special treatment special bits in fifth step 65 as well.

It will be appreciated that various refinements may be added to the process of the figure. As an example, in third step 63 the test pattern selector 20 may insert additional gates immediately in front of the timing sensitive flip-flops 32 that receive data influenced by source flip-flops in other clock domains. In this case the additional gate 30 suppresses the dependence on data from the source flip-flops if any of the domains contain source flip-flop cells 34 that have mutually different input and output signals and has an enabled domain clock.

Alternatively, in third step test pattern selector 20 may search for circuit nodes for adding the additional gates to the electronic description among the logic circuits 12, further apart from the timing sensitive flip-flop cell 32. In this case any set of circuit nodes is selected through which the input of the timing sensitive flip-flop cell 32 depends on signals from the source flip-flop cells 34 in other clock domains. Additional gates 30 are added at the circuit nodes, to suppress the dependence of the signal circuit node on data from the source flip-flop cells 34 from the other clock domains if any of the domains that normally affect the signal at the circuit node contain source flip-flop cells 34 that have mutually different input and output signals and has an enabled domain clock.

For this purpose test pattern selector 20 preferably selects a set of internal circuit nodes in logic circuit 12 whose signal may influence the input signal at the timing sensitive flip-flop cell 32 and carry a signal that depends on data from flip-flops cells 34 in only one clock domain.

Instead of adding comparison circuits 40 immediately at the flip-flop cells, the comparison circuit may be added at the intermediate circuit node, with one input coupled to a copy of the preceding part of the logic circuit that has its inputs coupled to the inputs of the source flip flops. However, this is only possible if the nature of the circuit is so that no glitches can occur.

In second step 62 the test pattern selector 20 may trace back through the design of the circuit, from an input of each particular flip-flop cell 10a-c, to find the source flip-flop cells 10a-c that affect the signal at the input of the particular flip-flop cell 10a-c. The test pattern selector 20 next detects whether at least one of these source flip-flop cells 10a-c belongs to a further source clock domain other than the particular clock domain of the particular flip-flop cell 10a-c. In this case the particular flip-flop cell 10a-c is considered to be a timing sensitive flip-flop cell 10a-c.

Furthermore, it will be appreciated that, instead of using a pre-processing step to "fool" a conventional single clock domain test pattern selector 20 into making a set of test pattern for a virtual circuit, a dedicated test pattern generation algorithm may be used that takes account of equality of inputs and outputs of flip-flop cells 10a-c in response to test patterns. For example, the relevant virtual circuits may be added dynamically during execution of a test pattern generation algorithm when the algorithm operates on a related part of the logic circuits. In another example, in an embodiment such a test pattern generation algorithm marks each test pattern to indicate which faults it will detect and searches for a set of patterns that together mark all faults. In this case, those faults that are uncertain to be detected due to timing variations are "unmarked" for a test pattern.

In another embodiment test pattern selector 20 generator 22 first merely generates a set of test input patterns for the original circuit design, ignoring any uncertainty due to timing uncertainty and subsequently generates versions of the test patterns from the set wherein selected clock signals are disabled. In this embodiment test pattern selector 20 identifies particular flip flops that have an input signal derived from source flip flop from other clock domains. The test pattern selector 20 generates added versions of a test pattern wherein the clocks form the other domains are disabled only if the input and output signals at the source flip-flops in the other clock domains in response to the test pattern are unequal.

The invention claimed is:

1. A circuit testing system, for testing a circuit under test with logic circuits and a scan chain comprising flip-flop cells with inputs and outputs operationally connected to the logic circuits, the circuit under test including a plurality of clock domains, each containing a respective part of the flip-flop cells that are clocked by a respective domain clock signal, the circuit testing system comprising:

a test controller arranged to switch the circuit under test to a test mode wherein the test controller supplies successive test input patterns through the scan chain, each test input pattern being associated with a respective combination of domain clock signals that are selectively enabled to capture a response of the logic circuits to the test input pattern into flip-flop cells of the scan chain, the test controller using the captured response from at least part of the flip-flop cells to detect faults in the circuit under test;

a test pattern selector arranged to select a set of test input patterns and the associated combinations of domain clock signals for use by the test controller, wherein a particular test pattern in the selected set has the properties that, when the particular test pattern is applied by the test controller:

the response to the particular test pattern captured by a timing sensitive flip-flop cell in a first clock domain is indicative of a fault condition, the timing sensitive flip-flop cell receives data dependent on data from a source flip-flop cell that operates on a second clock domain different from the first clock domain, the combination of selectively enabled domain clock signals for the particular test pattern comprises the clocks of both the first and second domain, and the data value in the source flip-flop cell is identical to a response value captured by the source flip-flop cell for the particular test pattern.

2. The circuit testing system according to claim 1, wherein the test pattern selector:

stores information representing an original design that corresponds to the circuit under test;

includes, with each test pattern, clock status signals that indicate whether respective ones of the domain clocks must be disabled during capture of a response to the test pattern;

generates an adapted version of the original design, wherein additional logic circuits have been added to the original design, the additional logic circuits being designed to selectively enable a dependence of an input signal of the timing sensitive flip-flop cell on data from the source flip-flop according to the original design, when the clock status signals indicate that the second domain clock is disabled, the additional circuits also enabling the dependence when the input and output signals of the source flip-flop cell are identical and the second domain clock is enabled;

uses the adapted version to select the test patterns with associated clock status signals so that a set of logic circuit faults is covered for the adapted version.

3. A method of testing a circuit under test with logic circuits and a scan chain comprising flip-flop cells with inputs and outputs operationally connected to the logic circuits, the circuit under test comprising a plurality of clock domains, each containing a respective part of the flip-flop cells that are clocked by a respective domain clock signal; the method comprising:

selecting a set of test input patterns each with an associated combination of domain clock signals that will be selectively enabled to capture a response to the test pattern, wherein the set contains a particular test pattern that has the properties that, when the particular test pattern is applied:

the response to the particular test pattern captured by a timing sensitive flip-flop cell in a first clock domain is indicative of a fault, the timing sensitive flip-flop cell receives data dependent on data from a source flip-flop cell that operates on a second clock domain different from the first clock domain, the combination of selectively enabled domain clock signals for the particular test pattern comprises the clocks of both the first and second domain, and the data value in the source flip-flop cell is identical to a response value captured by the source flip-flop cell for the particular test pattern;

switching the circuit under test to a test mode, supplying successive test input patterns from said set through the scan chain, including the particular test pattern;

selectively enabling the combination of domain clock signals for each test pattern to capture a response of the logic circuits to the test pattern into flip-flop cells of the scan chain, using the captured response from at least part of the flip-flop cells to detect faults in the circuit under test, including the response captured by the timing sensitive flip-flop cell in response to the particular test pattern.

4. The method of testing according to claim 3, wherein the step of selecting the set of test patterns comprises:

receiving information representing an original design that corresponds to the circuit under test;

including with each pattern clock status signals that indicate whether respective ones of the domain clocks will be disabled during capture of a response to the pattern;

generating an adapted version of the original design wherein additional logic circuits have been added to the original design, the additional logic circuits being designed to selectively enable a dependence of an input signal of the timing sensitive flip-flop cell on data from the source flip-flop cell according to the original design, when the clock status signals indicate that the second domain clock is disabled, the additional circuits also being designed to enable the dependence when the input and output signals of the source flip-flop cell are identical and the second domain clock is enabled;

selecting the set of test patterns with associated clock status signals for the adapted version so that a set of logic circuit faults is covered for the adapted version.

5. The method of testing according to claim 4, comprising:

tracing back from the input of the timing sensitive flip-flop cell through the logic circuits in the original design until a circuit node is encountered at which node signals depend on the data from the source flip-flop cell but not on any data from flip-flop cells outside the first and second clock domain;

said generating including adding an additional gate in the adapted version of the design at said circuit node to realize said selectively enabled dependence.

6. A medium carrying a set of test patterns for testing a circuit under test with logic circuits and a scan chain comprising flip-flop cells with inputs and outputs operationally connected to the logic circuits, the circuit under test including a plurality of clock domains, each containing a respective part of the flip-flop cells that are clocked by a respective domain clock signal; each of the set of test input patterns being associated with an associated combination of domain clock signals that will be selectively enabled to capture a response to the test pattern, wherein the set contains a particular test pattern that has the properties that, when the particular test pattern is applied:

the response to the particular test pattern captured by a timing sensitive flip-flop cell in a first clock domain is indicative of a fault, the timing sensitive flip-flop cell receives data dependent on data from a source flip-flop cell that operates on a second clock domain different from the first clock domain, the combination of selectively enabled domain clock signals for the particular test pattern comprises the clocks of both the first and second domain, and the data value in the source flip-flop cell is identical to a response value captured by the source flip-flop cell for the particular test pattern.

7. A method of generating a set of test patterns for a circuit under test with logic circuits and a scan chain comprising flip-flop cells with inputs and outputs operationally connected to the logic circuits, the circuit under test including a plurality of clock domains, each containing a respective part of the flip-flop cells that are clocked by a respective domain clock signal; each test pattern being an associated combination of domain clock signals that will be selectively enabled to capture a response to the test pattern, the method comprising:

receiving information representing an original design that corresponds to the circuit under test;

including with each pattern clock status signals that indicate whether respective ones of the domain clocks will be disabled during capture of a response to the pattern;

generating an adapted version of the original design wherein additional logic circuits have been added to the original design, the additional logic circuits being designed to selectively enable a dependence of an input signal of the timing sensitive flip-flop cell on data from the source flip-flop cell according to the original design, when the clock status signals indicate that the second domain clock is disabled, the additional circuits also being designed to enable the dependence when the input and output signals of the source flip-flop cell are identical and the second domain clock is enabled;

selecting the set of test patterns with associated clock status signals for the adapted version so that a set of logic circuit faults is covered for the adapted version.

8. A method generating a set of test patterns according to claim 7, the method comprising:

tracing back from the input of the timing sensitive flip-flop cell through the logic circuits in the original design until a circuit node is encountered at which node signals depend on the data from the source flip-flop cell but not on any data from flip-flop cells outside the first and second clock domain;

said generating including adding an additional gate in the adapted version of the design at said circuit node to realize said selectively enabled dependence.

9. A test pattern generating machine for generating a set of test patterns for a circuit under test with logic circuits and a scan chain comprising flip-flop cells with inputs and outputs operationally connected to the logic circuits, the circuit under test comprising a plurality of clock domains, each containing a respective part of the flip-flop cells that are clocked by a respective domain clock signal; each test pattern being an associated combination of domain clock signals that will be selectively enabled to capture a response to the test pattern, the machine being arranged to:

receive information representing an original design that corresponds to the circuit under test;

include with each pattern clock status signals that indicate whether respective ones of the domain clocks will be disabled during capture of a response to the pattern;

generating an adapted version of the original design wherein additional logic circuits have been added to the original design, the additional logic circuits being designed to selectively enable a dependence of an input signal of the timing sensitive flip-flop cell on data from the source flip-flop cell according to the original design, when the clock status signals indicate that the second domain clock is disabled, the additional circuits also being designed to enable the dependence when the input and output signals of the source flip-flop cell;

selecting the set of test patterns with associated clock status signals for the adapted version so that a set of logic circuit faults is covered for the adapted version.

10. A computer program product containing machine instructions for generating a set of test patterns for a circuit under test with logic circuits and a scan chain comprising flip-flop cells with inputs and outputs operationally connected to the logic circuits, the circuit under test comprising a plurality of clock domains, each containing a respective part of the flip-flop cells that are clocked by a respective domain clock signal; each test pattern being an associated combination of domain clock signals that will be selectively enabled to capture a response to the test pattern, the instructions being arranged to:

receive information representing an original design that corresponds to the circuit under test; include with each pattern clock status signals that indicate whether respective ones of the domain clocks will be disabled during capture of a response to the pattern;

generating an adapted version of the original design wherein additional logic circuits have been added to the original design, the additional logic circuits being designed to selectively enable a dependence of an input signal of the timing sensitive flip-flop cell on data from the source flip-flop cell according to the original design, when the clock status signals indicate that the second domain clock is disabled, the additional circuits also being designed to enable the dependence when the input and output signals of the source flip-flop cell are identical and the second domain clock is enabled;

selecting the set of test patterns with associated clock status signals for the adapted version so that a set of logic circuit faults is covered for the adapted version.

* * * * *